(12) United States Patent
Kyono et al.

(10) Patent No.: US 7,781,314 B2
(45) Date of Patent: Aug. 24, 2010

(54) NITRIDE SEMICONDUCTOR DEVICE MANUFACTURING METHOD

(75) Inventors: Takashi Kyono, Itami (JP); Masaki Ueno, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 14 days.

(21) Appl. No.: 11/958,315

(22) Filed: Dec. 17, 2007

(65) Prior Publication Data
US 2008/0132044 A1    Jun. 5, 2008

Related U.S. Application Data

(62) Division of application No. 10/514,261, filed on Nov. 3, 2004, now abandoned.

(30) Foreign Application Priority Data

Mar. 5, 2003    (JP)    ............... 2003-057983

(51) Int. Cl.
*H01L 21/306*    (2006.01)
*C30B 23/02*    (2006.01)

(52) U.S. Cl. .................. 438/503; 438/906; 438/607; 257/E21.226; 117/90; 134/1.3

(58) Field of Classification Search .......... 117/3, 117/93, 102, 105, 97, 90, 94, 106; 134/1.2, 134/1.3; 438/503, 607, 906; 257/E21.226

See application file for complete search history.

(56) References Cited

U.S. PATENT DOCUMENTS 4,579,609 A * 4/1986 Reif et al. ............... 117/97
5,011,789 A * 4/1991 Burns ..................... 117/90
5,308,788 A * 5/1994 Fitch et al. .............. 117/86
6,218,280 B1   4/2001 Krylionk et al.
6,336,970 B1   1/2002 Sakamoto et al.
6,447,604 B1 * 9/2002 Flynn et al. ............. 117/89
2002/0185054 A1  12/2002 Xu et al.
2003/0213964 A1 * 11/2003 Flynn et al. ............. 257/85
2004/0262624 A1 * 12/2004 Akita et al. ............. 257/90

FOREIGN PATENT DOCUMENTS

EP    1101842 A2    5/2001
JP    2004-502298 A    1/2004

* cited by examiner

*Primary Examiner*—David Vu
*Assistant Examiner*—Earl N Taylor
(74) *Attorney, Agent, or Firm*—James W. Judge

(57) ABSTRACT

Affords a manufacturing method enabling nitride-based semiconductor devices containing epitaxial films excelling in flatness and crystallinity to be easily produced. Method of manufacturing nitride semiconductor devices that are formed onto a semiconductor substrate being a compound containing nitrogen, and a Group IIIA element for forming compounds with nitrogen, including steps of: heating the semiconductor substrate (1) to a film-deposition temperature; supplying to the substrate a film-deposition gas containing a source gas for the Group IIIA element and a nitrogen source gas; and epitaxially growing onto the semiconductor substrate a thin film (2) of a compound containing nitrogen and the Group IIIA element; and being furnished with a step, in advance of the epitaxial growth step, of heating the semiconductor substrate to a pretreating temperature less than the film-deposition temperature, to clean the surface of the semiconductor substrate.

2 Claims, 6 Drawing Sheets

250 μm

50 μm

50 μm

250 μm

50 μm

250 μm

NITRIDE SEMICONDUCTOR DEVICE MANUFACTURING METHOD

CROSS-REFERENCE TO RELATED APPLICATIONS

This application is a division of U.S. patent application Ser. No. 10/514,261 filed Nov. 3, 2004, now abandoned, and incorporated herein by reference.

BACKGROUND OF THE INVENTION

1. Technical Field

The present invention relates to methods of manufacturing nitride semiconductor devices such as light-emitting devices; more specifically, the present invention relates to methods of manufacturing high-quality nitride semiconductor devices excelling in flatness and manufacturable at high yields.

2. Description of the Related Art

In the manufacture of light-emitting and other semiconductor devices, when vapor-phase epitaxial film growth is carried out with a nitride-based single crystal as a substrate, the substrate is annealed with the object of ridding the substrate of contaminants (organic matter, moisture) adhering to it, and defects (scratches, strain, etc.). Inasmuch as this heating process is performed prior to the epitaxial film growth, the process is called "pretreating," "preheating," "cleaning," "purification," or simply "annealing."

To date—and this is not limited to nitride semiconductors—the substrate heating temperature in removing the contaminants and defects has been made at or above the temperature to which the substrate is heated in the deposition process for growing an epitaxial film onto the post-treated substrate (patent documents including Japanese Unexamined Pat. App. Pub. Nos. 2000-174341 and 2000-323752). The motivation behind this is that it has taken over from a procedural operation, in methods of manufacturing silicon-based semiconductor devices, in which the substrate temperature for cleaning is made to be at or above the film-deposition temperature of the substrate—with cleaning being stressed, because the higher the substrate heating temperature in pretreating is made, the better cleaning will progress. In the manufacture of nitride-based semiconductor devices also, likewise as with silicon-based devices, the substrate surface can be cleaned by making the temperature to which the substrate is heated in the pretreating process be at or above the temperature to which the substrate is heated in the film-deposition process.

For nitride-based semiconductors, because the vapor pressure of nitrogen is high, when nitride single-crystal substrates are to be annealed at high temperature, nitrogen or an atmosphere containing atoms from the same group as that of nitrogen—Group VA in the periodic system—is used. An atmosphere from which source-material gas containing the Group IIIA element has been omitted from among the ambient gases that are introduced in the film-deposition operation is generally employed as the annealing atmosphere. The reason for this is because nitrogen tends to come loose from the surface part of the substrates, leading to surplus Group IIIA element there, which is liable to produce roughness in the surface of a nitride semiconductor substrate. Accordingly, to keep roughness originating in the accumulation of surplus Group IIIA element on the substrate surface from occurring, arrangements are made for an atmosphere as just noted that does not contain Group IIIA element, and the escape of nitrogen from the substrate is controlled.

No matter what the atmosphere employed, as discussed above, in conventional annealing, in order to enhance the cleaning effectiveness the substrate is heated to at or above the heating temperature during film deposition. In the case of nitride-based semiconductors, nevertheless, heating the nitride substrate for semiconductor device fabrication to at or above the temperature to which it is heated during film deposition provokes the breaking away of nitrogen from the substrate surface or the decomposition of ammonia ($NH_3$), which renders necessary considerable labor for optimizing the gas-supply parameters—in which there are immense options. As an extreme example, carrying out pretreatment under the same gas-supply conditions as during film deposition ruins the planarity of the nitride semiconductor substrate and, with the epitaxial film formed during the film deposition not being flat, leads to three-dimensional growth. The consequent problem has been that growing epitaxial films using nitride single-crystal substrates has meant that the gas-supply requirements in the foregoing substrate cleaning process have to be sought out by trial and error

BRIEF SUMMARY OF THE INVENTION

An object of the present invention is to make available a method of manufacturing nitride-based semiconductor devices wherein epitaxial films excelling in flatness and crystallinity can be grown onto nitride semiconductor substrates.

A method according to the present invention of manufacturing nitride-based semiconductor devices is a method of manufacturing nitride semiconductor devices that are formed onto a semiconductor substrate that is a compound containing nitrogen, and a Group IIIA element for forming compounds with nitrogen. This manufacturing method includes steps of heating the semiconductor substrate to a film-deposition temperature, supplying to the substrate a film-deposition gas containing a source-material gas for the Group IIIA element, together with a nitrogen source-material gas, and epitaxially growing onto the semiconductor substrate a thin film of a compound containing nitrogen and the Group IIIA element. In addition, the method is furnished with a step, in advance of the epitaxial growth step, of heating the semiconductor substrate to a pretreating temperature less than the film-deposition temperature, to clean the surface of the semiconductor substrate.

According to this method, in a departure from the conventional wisdom, the substrate surface is cleaned by heating the substrate to a temperature lower than the substrate-heating temperature in the film deposition process. The fact that the substrate heating temperature is comparatively high from the outset in the course of growing a nitride-semiconductor epitaxial film makes it possible to set the pre-heating temperature in the cleaning step to what will guarantee sufficient cleaning action. Satisfactory planarity along the substrate surface can therefore be ensured, and the flatness of the epitaxial film formed on the substrate surface proves to be superior as a result.

It should be understood that since the substrate heating temperature will differ depending on the location of the temperature sensors or temperature gauges furnished in the thin-film formation equipment, or on how the instruments are mounted, it is sufficient that, according to the same temperature indicator within the film-deposition device, the heating temperature during cleaning is lower than the substrate temperature during film deposition—the absolute numerical value of the temperature will not be an issue.

In the foregoing semiconductor-substrate cleaning step, a pretreatment gas in which the proportion of Group-IIIA-element source gas has been reduced below what it is in the film-deposition gas for the epitaxial growth step can be supplied.

In accordance with this method, lowering what the substrate temperature measures during the cleaning step minimizes the likelihood that precedential breaking away of nitrogen—originating in the fact that the vapor pressure of nitrogen is high—as well as accumulation of excess Group IIIA element will occur, making it possible to avert degradation of the front-side planarity. One example of the aforementioned pretreatment gas may be one made not to contain Group-IIIA-element source gas. Gas from which source-material gas containing the Group IIIA element has been omitted from among the ambient gases that are introduced in the film-deposition step can be utilized as such a pretreatment gas. As a result, the necessity of having to seek out by trial and error the requirements for gas-supply during the cleaning process is eliminated, wherein the parameters for an efficient cleaning operation can be set.

Group IIIA elements include Al (aluminum), Ga (gallium) and In (indium), wherein the fabrication at high yields of semiconductor devices in which semiconductors that are nitrides of these elements are the base—semiconductor devices of laminated construction, excelling in flatness over what has been conventional—becomes possible.

Nitride-based semiconductor devices by the present invention are furnished with a semiconductor substrate that is formed from a compound containing nitrogen and a Group IIIA element for forming compounds with nitrogen, and are further furnished with, formed onto the semiconductor substrate, an epitaxial semiconductor film containing nitrogen and the Group IIIA element. Therein, the smoothness of the semiconductor substrate surface is 15 nm or less in root-mean-square roughness.

By having the foregoing root-mean-square roughness (RMS) be 15 nm or under, the planarity of the epitaxial film formed on the surface of the nitride semiconductor substrate can be made superlative. Having it that the RMS roughness exceeds 15 nm gives rise to hexagonal hillocks when the epitaxial film has been formed to a thickness of approximately 2 µm, in which case not only that epitaxial film, but also epitaxial films formed onto it turn out to be layers in which the crystallinity is spoiled, which degrades the device quality. What is more, if the RMS roughness of the substrate surface were to surpass 15 nm, the epitaxial deposition would not grow into a continuous film when having been formed to a thickness on the order of 0.5 µm, on account of the unevenness in the substrate surface.

It should be noted that the foregoing roughness is based on the results of measuring the surface smoothness using atomic-force microscopy (AFM) after the nitride semiconductor substrate had been pretreated, without an epitaxial film having been deposited onto the substrate.

The root-mean-square roughness of the semiconductor substrate may, moreover, be rendered 5 nm or less. By this configurational aspect a semiconductor substrate of all the more outstanding planarity is afforded, and the flatness and crystallinity of an epitaxial film formed onto the substrate can be made excellent.

It is advisable to have the 10-point peak-and-valley mean roughness Rz of the epitaxial film may be 15 nm or less.

This configurational aspect not only makes excellent the crystallinity and flatness of the epitaxial film itself, but also contributes to guaranteeing the crystallinity and flatness of epitaxial films that are formed onto this epitaxial film.

The Rz roughness is determined based on peaks and valleys on an epitaxial film that is as noted above, in the state in which no thin films have been further grown onto the epitaxial film. Utilizing any sort of method as long as the method can detect roughness of the epitaxial film after it has been built up with semiconductor devices, measurement of the roughness may be by any sort of method as long as it can gauge the epitaxial smoothness.

It is to be noted that general reference literature states that for 10-point mean roughness Rz, measuring in a sampling length, along a direction that scales vertically from an averaging line, from the highest peak to the fifth highest peak and from the lowest valley to the fifth lowest valley, the mean of the absolute values of the respective altitudes (distances from the averaging line) is found, and the mean value is expressed in µm. In the present description, since the altitudes that are measured are nanoscale, the mean of the absolute values is expressed in nm. An example that can be cited of such reference literature is Kiyoshi Onishi, Manual of JIS-Based Mechanical Design Drafting, $10^{th}$ Ed., Rikogakusha Ltd., Ch. 17, p. 57.

The 10-point mean roughness Rz of the epitaxial film may, moreover, be rendered 7.5 nm or less. More outstanding flatness and crystallinity of the film are ensured as a result to enable high-quality semiconductor devices to be fabricated with good yields.

In another aspect of the present invention, the front-side surface of the epitaxial film is kept from having peaks and valleys of 50 nm to 150 nm height appearing at a pitch of 100 µm to 150 µm.

In instances in which hexagonal hillocks on the epitaxial film have formed because the flatness of the semiconductor substrate is unsatisfactory, the hexagonal hillocks are observed to be peaks and valleys of 50 nm to 150 nm height at a pitch of 100 µm to 150 µm. Having the RMS roughness of the semiconductor substrate be, as stated above, no more than 15 nm makes it so that the hexagonal hillocks do not arise. The consequent benefit is that, excelling in flatness, the epitaxial film makes it possible to improve the crystallinity of films formed onto the epitaxial film.

(It should be noted that in the parent application Ser. No. 10/514,261, of which the present application is a divisional, Applicant submitted three sheets of black-and-white photographs in lieu of the three sheets containing, respectively, FIGS. 3A through 3C, FIGS. 4A through 4C, and FIGS. 5A through 5C. These photographs-as-drawings were placed into an "Artifact File" because they could not be adequately scanned into the USPTO's Image File Wrapper system. The drawings accompanying the instant specification include not reprints, but merely photocopies, of the three sheets of photographs-as-drawings containing FIGS. 3A-5C. Nevertheless, it is believed that the original black-and-white photographs should be available to both the examining corps and the general public by requesting access to the Artifact File for application Ser. No. 10/514,261.)

DETAILED DESCRIPTION OF THE INVENTION

Best Mode for Carrying Out the Invention

Figure 1:
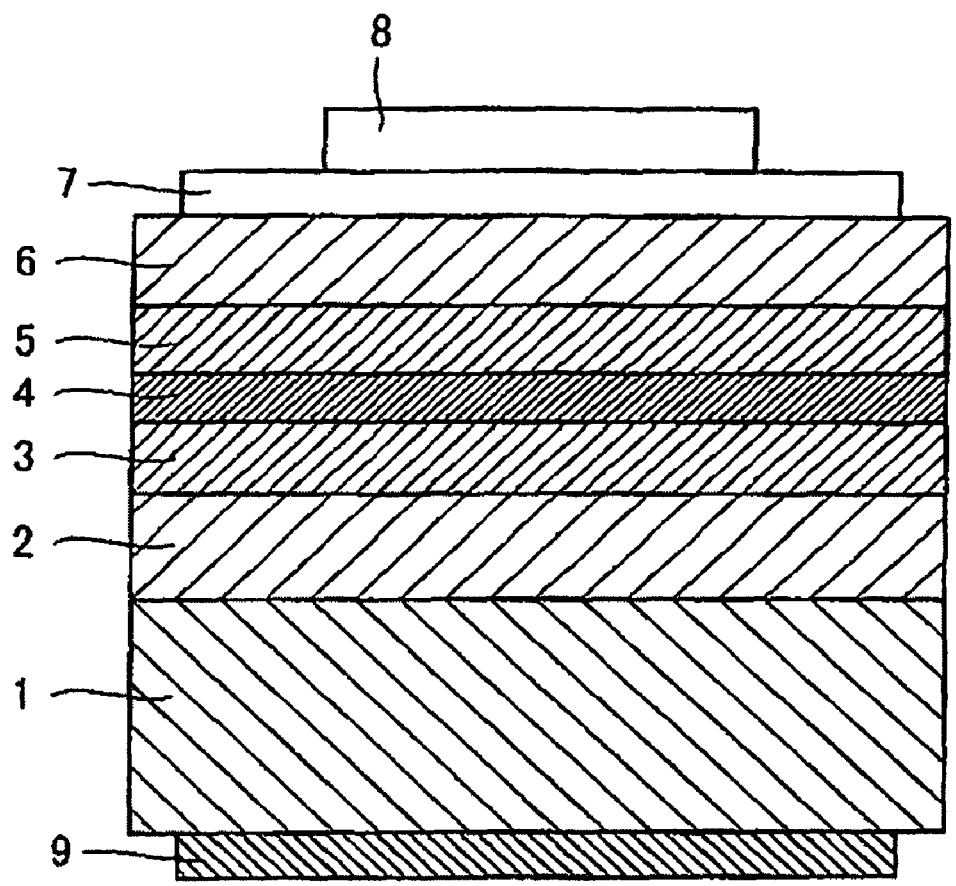
FIG. 1 is a sectional view representing a blue LED that is a nitride semiconductor device in an embodiment of the present invention.

Next, embodiments of the present invention will be described using the drawings. FIG. 1 is a diagram representing a light-emitting device that is a semiconductor device in an embodiment of the present invention. On the back side of a GaN substrate 1 in FIG. 1, a Ti—Al layer 9 that forms an n-type electrode is provided. An n-type buffer layer 2 consisting of a GaN film doped with Si is epitaxially grown onto the front side of the GaN substrate 1. An n-type cladding layer 3 consisting of an epitaxial film—an $Al_{0.07}GaN$ film—containing Si is formed onto the n-type buffer layer 2.

An active layer 4 that is the light-emitting portion is situated between the n-type cladding layer 3 and a p-type cladding layer 5. The active layer 4 is formed as an $In_{0.2}GaN$—GaN multi-quantum well structure. In turn, the p-type cladding layer 5 atop the active layer 4 is formed as an $Al_{0.07}GaN$ film containing Mg as a dopant. In order to secure favorable crystallinity in these layers each is formed as an epitaxial film.

Atop the p-type cladding layer 5, a p-type contact layer 6 consisting of a GaN film containing Mg, and further, atop that, a p-type electrode 7 consisting of a Ni—Au metal film are provided. Over that a pad electrode 8 is formed.

By applying an electric potential across the p-type and n-type electrodes, a current is injected into the active layer, giving rise to recombination of electrons and holes across the conduction band and the valence band, whereby light emission is produced.

In the above-described light-emitting device, the front side of the GaN substrate 1 in the cleaning step undergoes a cleaning process whereby the substrate is heated to a temperature lower than the temperature of the substrate when in the film-deposition step. Roughness in the front side of the GaN substrate 1 is thereby held down to being 15 nm or less in root mean square (RMS) roughness, and can moreover be brought to 5 nm or less.

As described above, minimizing roughness of the semiconductor-substrate front side and forming epitaxial films onto that front side enables the crystal properties of the epitaxial films to be made superb. As a result, the quality of light-emitting characteristics can be enhanced—such as in emission-efficiency improvement and in narrowed emission-beam width.

A further advantage is that enhancing the flatness of the n-type buffer layer 2 on the GaN substrate to simplify the structure of the light-emitting device enables yields to be improved. Peaks and valleys at a 100 μm to 150 μm pitch should not be present on the front-side surface of the n-type buffer layer; in other words, the layer should be made not to produce hexagonal hillocks. This may be realized, as discussed above, getting the RMS roughness of the semiconductor substrate to be 15 nm or less. Likewise, the 10-point mean roughness Rz of the epitaxial film surface can be rendered 15 nm or less. The roughness Rz can even be made 7.5 or less. Naturally, these curbs on the roughness, through improvement in crystal properties and improvement in flatness, contribute to improving the quality of the semiconductor devices and to improving manufacturing yields.

Figure 2:
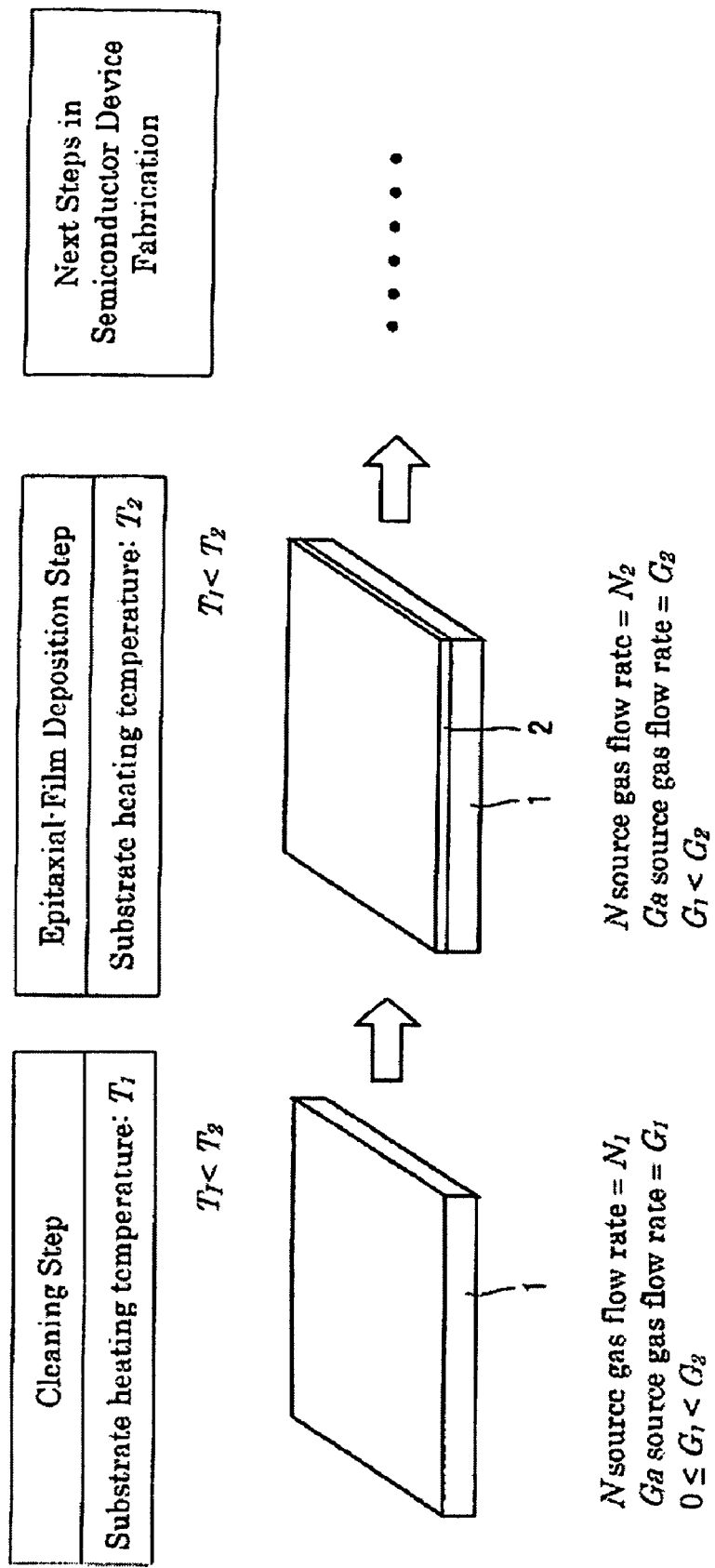
FIG. 2 is a diagram illustrating a method, in an embodiment of the present invention, of manufacturing nitride semiconductor devices.

FIG. 2 is a diagram that explanatorily illustrates a method of manufacturing semiconductor devices as described above. Initially, with $T_1$ the substrate heating temperature in the cleaning step, the temperature $T_1$ is lower than the substrate heating temperature $T_2$ in the following film-deposition step. The flow rate of the nitrogen source gas is given as $N_1$, and the flow rate of the Ga source gas—trimethylgallium (TMG) for example—as $G_1$. $G_1$ may be zero. Hydrogen gas and other source gases may be included as well.

In the film-deposition step, the substrate heating temperature is given as $T_2$, the flow rate of the nitrogen source gas as $N_2$, and the flow rate of the Ga source gas as $G_2$. In the present invention, the substrate heating temperatures $T_2 > T_1$, and the condition that the flow rates of the Ga source gas be $G_2 > G_1 \geqq 0$ is imposed. And as far as the source-material gases (ambient) are concerned, the flow rate of the Ga source gas in the cleaning step is made lower than what it is in the film-deposition step, but the addition or subtraction of other source gases is not performed.

Conventionally, when heteroepitaxial films are formed using a heterosubstrate such as sapphire, removing surface contamination by pretreating the sapphire substrate in a hydrogen atmosphere has worked to the advantage of subsequent nucleation of the heteroepitaxial film. In instances in which a homoepitaxial film is formed onto a GaN substrate, however, using hydrogen to pretreat the substrate promotes the breaking away of N from the surface, leading to surface devastation. The reasons for this will be explained in more detail as follows.

In depositing a homoepitaxial film onto a substrate the following three events conflict with each other. Namely, the three events are: (g1) the breaking away of Ga and N; (g2) the supplying of Ga from the Ga source gas; and (g3) the supplying of N from the N source gas. When a homoepitaxial film is going to be deposited, with the rates at which the foregoing events progress being appropriately related, a homoepitaxial film proceeds to form. The source-material gas supply requirements for this situation are referred to as the "film-deposition source-gas supply requirements."

During the cleaning process (pretreating) gases are also supplied, to form an ambient; for this case the term is "pretreating-gas supply requirements." The general practice is to have the pretreating gas supply requirements be the aforementioned film-deposition source-gas supply requirements minus the Ga source gas (Group III source gas). Under these pretreating-gas supply conditions, if the GaN substrate temperature is the same as the temperature of the substrate during film deposition, or exceeds that temperature, since Ga is not supplied, Ga atoms left by the breaking away of N turn out to be present in excess, as does otherwise, with respect to Ga droplets, $NH_3$ as the N source gas. As a consequence, prior to migrating into steps or scratches, relatively in excess Ga ends up forming fresh GaN. This results in fine corrugations being produced in the surface of the GaN substrate after the pretreatment. If epitaxial deposition onto a GaN substrate having such corrugations is carried out, the deposition grows three-dimensionally, and at the stage in which the GaN deposition is, for example, ca. 0.5 μm thick, a continuous film will not form.

Again with heteroepitaxial film deposition, since ELO (epitaxial lateral overgrowth) technology is often employed to create GaN substrates atop heterosubstrates, the product comes out with portions coalescing in which the crystal orientations are slightly misaligned with each other. In a situation in which an epitaxial film is being grown onto such a GaN substrate, because epitaxial depositions having inherited the crystal orientation of the base will at a certain stage coalesce, hexagonal hillocks will be prone to arise. The crystallinity of the epitaxial films in the completed semiconductor device will consequently be compromised, which not only degrades the quality of the device but also causes a drop in yields during manufacture.

Making the preheating temperature lower than the film-deposition temperature rids the GaN substrate surface of imbalances from accumulation and breaking away of the atoms constituting the epitaxial film, even with a pretreating gas in which Ga source gas has been omitted from the film-deposition gases being employed. A substrate front side of favorable flatness and crystallinity, suited to growing epitaxial films, can be achieved as a result. Since it involves only one parameter, optimizing the substrate temperature is easy compared with optimizing the preheating-gas supply conditions. Moreover, since the temperatures at which nitride semiconductor films are deposited are fundamentally high, even with the preheating temperature made lower than the film-deposition temperature, there is no harm to the cleaning effectiveness.

In the foregoing pretreating-gas supply requirements, the gas flow rate in supplying the source gases that, with the source gas for Ga or other Group III element being omitted, remain may be made the same as the gas flow rate during film deposition. Inasmuch as the pretreating temperature is lower than the film-deposition temperature, there will be no occurrence of the imbalances noted above. Therefore, simply by omitting the Ga source gas from the film-deposition-gas supply requirements as described above, optimization of the pretreating-gas supply requirements by designating an immense number of parameters need not be carried out.

Embodiment & Comparative Example

A GaN substrate was utilized, and a cleaning process (pretreatment) was implemented on the GaN substrate, onto which a homoepitaxial film was thereafter deposited. The pretreating conditions and film-deposition conditions are as noted below.

Pretreating Conditions
Nitrogen: 20 slm
Hydrogen: 15 slm
Ammonia: 5 slm
Substrate temperature—Present invention example: 1025° C.;
Comparative example: 1150° C.
Pretreating time—10 minutes Film-Deposition Conditions
Nitrogen: 20 slm
Hydrogen: 15 slm
Ammonia: 5 slm
TMG: 19 sccm
Substrate temperature—1150° C.

Utilized as the GaN substrate was a bulk crystal prepared by growing a thick GaN film onto a GaAs substrate with $SiO_2$ made the mask and thereafter removing the GaAs substrate. (Cf. PCT Gazette Pub. No. WO99/23693.) In the pretreatment, the Ga source gas TMG was omitted, and ammonia as the nitrogen source gas, and nitrogen and hydrogen as the carrier gases alone were flowed according to the same flow parameters as those in the film-deposition conditions noted above. The root-mean-square (RMS) roughness of the substrate after having undergone the pretreatment was assessed using atomic force microscopy (AFM).

Figure 3A:
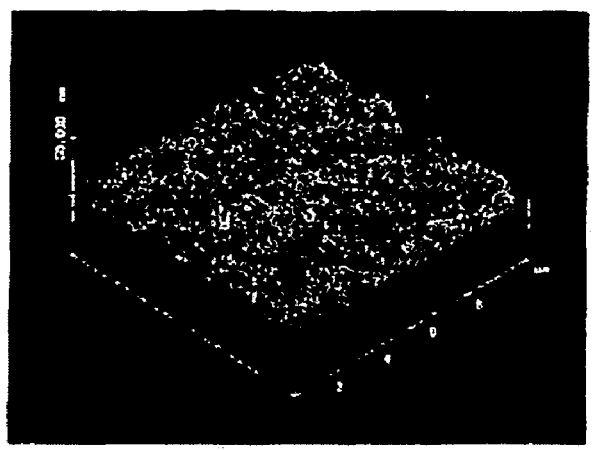
FIG. 3 is views showing surface morphology in 10 µm×10 µm of the surface of GaN substrates, being micrographs depicting the surface morphology of, in FIG. 3A, a raw substrate that had not been pretreated.
in FIG. 3B, a GaN substrate that underwent pretreating at 1025° C.; and in FIG. 3C, a GaN substrate that underwent pretreating at 1150° C.
Figure 3B:
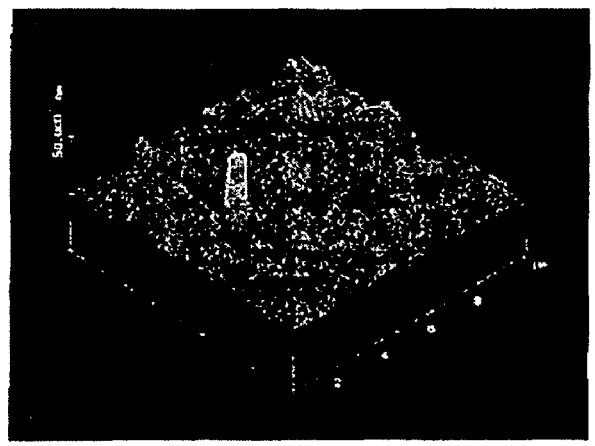
Figure 3C:
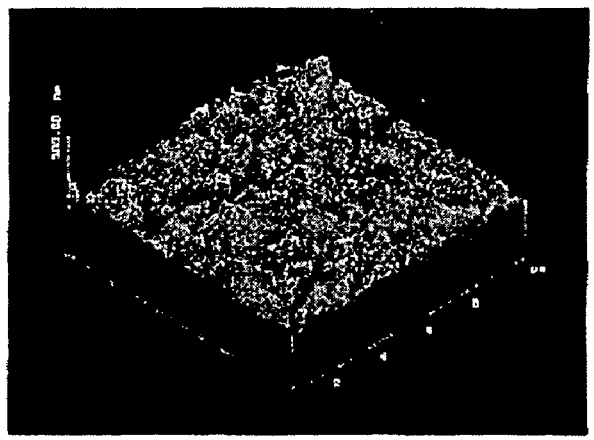

FIG. 3 is micrographs made using AFM, showing 10 μm×10 μm of roughness, for RMS calculations, along the front side of the GaN substrate. The views show results for, in FIG. 3A, a GaN substrate with no pretreatment (raw substrate/comparative example); in FIG. 3B, a GaN substrate that underwent pretreating at a 1025° C. substrate temperature (present-invention example); and in FIG. 3C, a GaN substrate that, similarly as is conventional, underwent pretreating at a substrate temperature that was the same as the film-deposition temperature (comparative example). Then, RMS calculations for the foregoing samples within 2 μm×2 μm and 10 μm×10 μm bounds are set forth in the Table.

TABLE

| | Root-Mean-Square (RMS) Roughness | | |
|---|---|---|---|
| | Conditions | | |
| Scan field | No pretreatment | 1150° C.; 10 min. | 1025° C.; 10 min. |
| 2 μm × 2 μm | 1.3 nm | 25.6 nm | 0.6 nm |
| 10 μm × 10 μm | 2.0 nm | 23.6 nm | 1.5 nm |

According to FIG. 3 and the table, the sample pretreated at a substrate temperature that was the same 1150° C. that is the film-deposition temperature had an RMS roughness of over 20 nm; thus its surface roughness compared to that of the raw substrate on which pretreatment had not been carried out had grown drastically, deteriorating the substrate quality. The size of a single gradation along the z-axis in FIG. 3C is ten times that of the z-axes in FIGS. 3A and 3B, and although the magnitude of the disparity just noted is thus somewhat hard to discern, the disparity is unmistakable.

On the other hand, with the sample (present-invention example) pretreated at a substrate temperature lower than the film-deposition temperature, the 2 μm×2 μm RMS roughness is 0.6 nm, which is markedly superior to the 1.3 nm of the raw substrate. The 10 μm×10 μm RMS roughness, 1.5 nm, is superior to the 2.0 nm of the raw substrate, and proved to measure one order of magnitude smaller than the 23.6 nm RMS roughness of the comparative example.

As described in the foregoing, by pretreating a GaN substrate at a substrate temperature lower than the 1150° C. film-deposition temperature, the substrate is cleaned without its flatness being harmed. As described in the foregoing, by forming an epitaxial film onto a GaN substrate that has been pretreated at a substrate temperature of 1025° C., an atomically stepped surface in which the RMS roughness is 0.5 nm or less can be achieved.

Figure 4A:
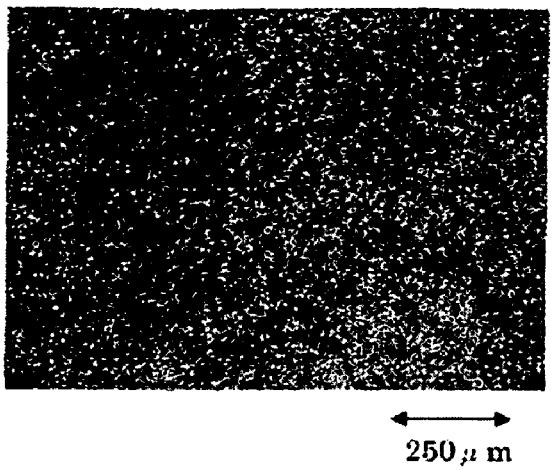
FIG. 4 is views showing observations by differential interference contrast microscopy of the surface of a semiconductor device in respective fabrication stages in the present invention, the views being photographs of, in FIG. 4A, the substrate after being pretreated at 1025° C.
in FIG. 4B, a GaN film having been grown to a layer thickness of 0.5 µm onto the substrate in FIG. 4A; and in FIG. 4C, the GaN film having been grown to a layer thickness of 2 µm onto the FIG. 4A substrate.
Figure 4B:
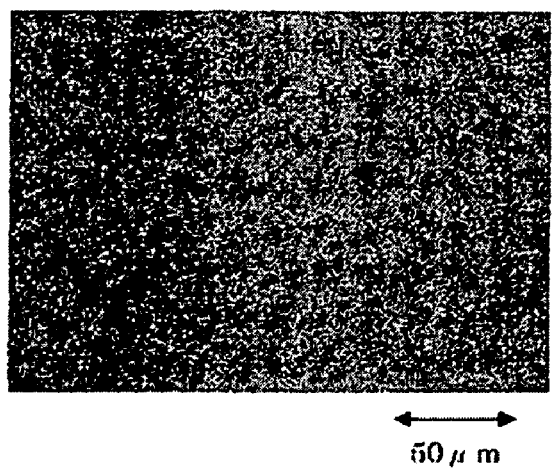
Figure 4C:
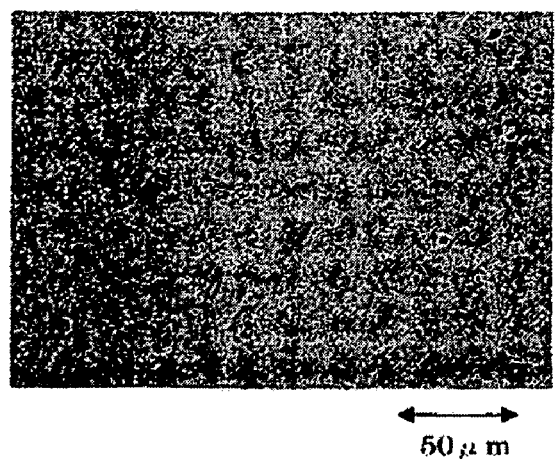
Figure 5A:
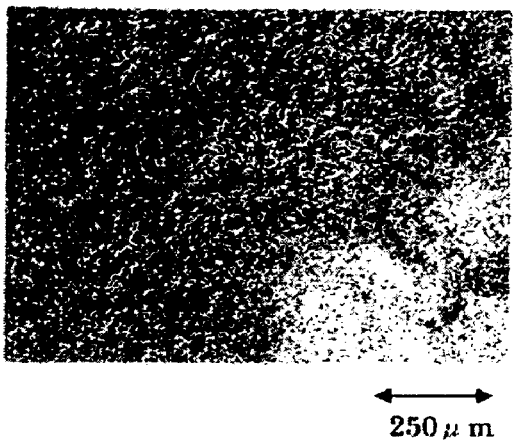
FIG. 5 is views showing observations by differential interference contrast microscopy of the surface of a semiconductor device in respective fabrication stages in a comparative example, the views being photographs of, in FIG. 5A, the substrate after being pretreated at 1150° C.
in FIG. 5B, a GaN film having been grown to a layer thickness of 0.5 μm onto the substrate in FIG. 5A; and in FIG. 5C, the GaN film having been grown to a layer thickness of 2 μm onto the substrate in FIG. 5A.
Figure 5B:
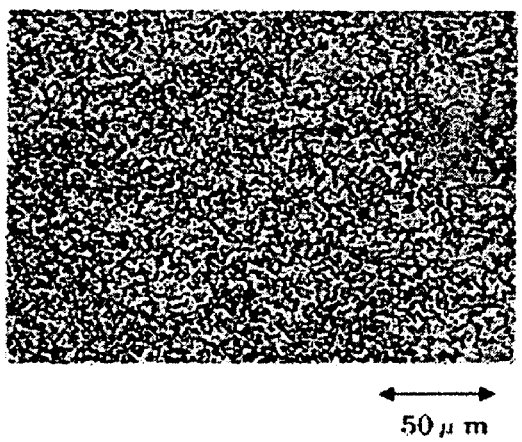

FIG. 4 is views showing results of using differential interference contrast microscopy to observe, following stages, the surface of a sample in an example of the present invention. FIG. 4A is a photograph in which a GaN substrate after being pretreated correspondingly to the substrate in FIG. 3B is observed by differential interference microscopy; FIG. 4B is a photograph of a GaN film at the point at which it has been epitaxially grown, according to the foregoing film-deposition conditions, 0.5 µm thick onto the GaN substrate; and FIG. 4C is a photograph of the GaN film after it has been epitaxially grown 2 µm thick. In turn, FIG. 5 is views showing results of likewise using differential interference contrast microscopy to observe, following stages, the surface of a sample in a comparative example corresponding to that of FIG. 3C. FIG. 5A is a photograph in which a GaN substrate after being pretreated correspondingly to the substrate in FIG. 3C is observed by differential interference microscopy; FIG. 5B is a photograph of a GaN film at the point at which it has been epitaxially grown, according to the foregoing film-deposition conditions, 0.5 µm thick onto the GaN substrate; and FIG. 5C is a photograph of the GaN film after it has been epitaxially grown 2 µm thick.

As will be understood by comparing FIGS. 4 and 5, the disparity in surface roughness of the GaN substrates after the pretreatments is clearly confirmed by differential interference microscopy as well, with the roughness in the surface, shown in FIG. 4A, of the present-invention example being less than that of the surface, shown in FIG. 5A, of the comparative example.

Furthermore, when a comparison of the GaN films at the point at which they had been deposited to 0.5 µm on the post-pretreated GaN substrates is made, from FIG. 4B of the present-invention example the GaN film proves to have been formed continuously, while from FIG. 5B of the comparative example, the GaN film turns out to have grown three-dimensionally without the layer forming continuously.

Figure 5C:
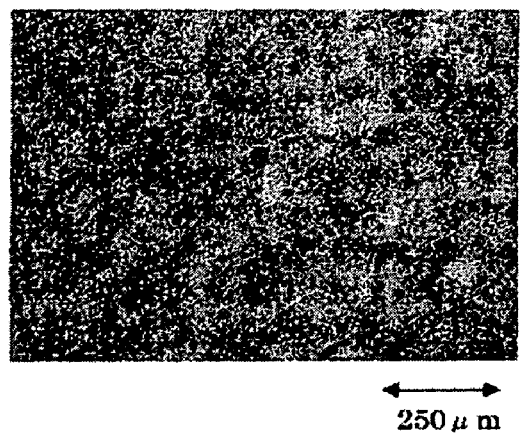

Likewise, from a comparison of the GaN films at the point at which they had been deposited to 2 µm on the post-pretreated GaN substrates, it is evident that from FIG. 4C of the present-invention example a flat GaN film formed, while from FIG. 5C of the comparative example, hexagonal hillocks were generated, in which the just-noted discontinuous film that grew three-dimensionally came out coalesced. In other words, in the comparative example a GaN film of inferior flatness and crystallinity formed.

Figure 6:
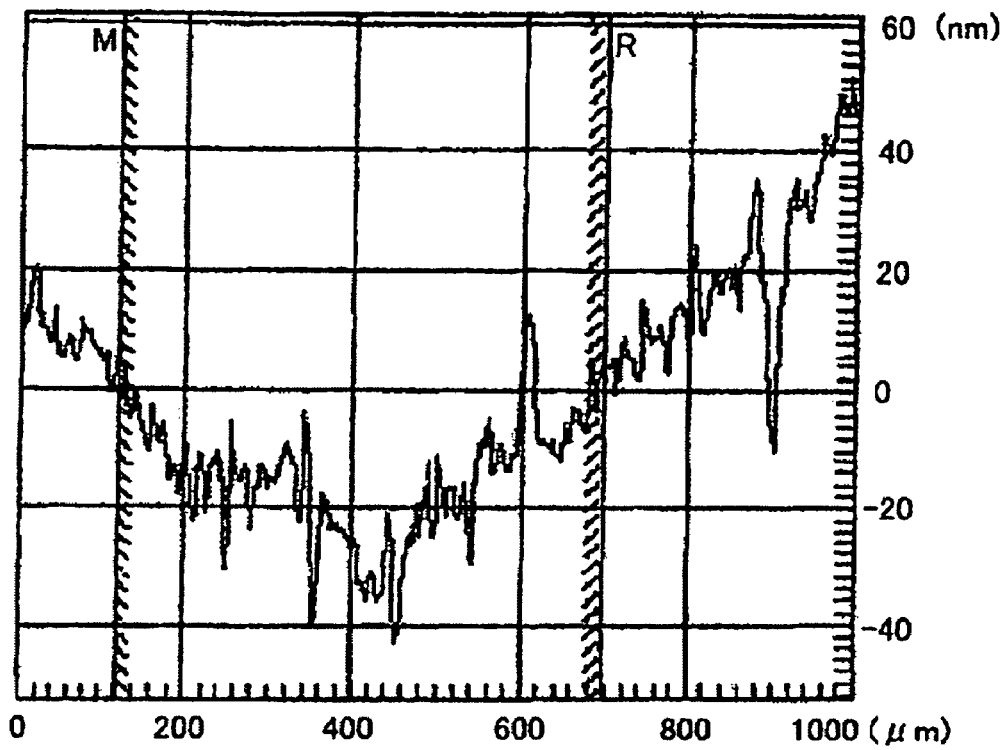
FIG. 6 is a diagram showing the results of measuring, using a stylus surface profilometer, the surface roughness of a GaN film corresponding to that in FIG. 4C, deposited at a thickness of 2 μm.
Figure 7:
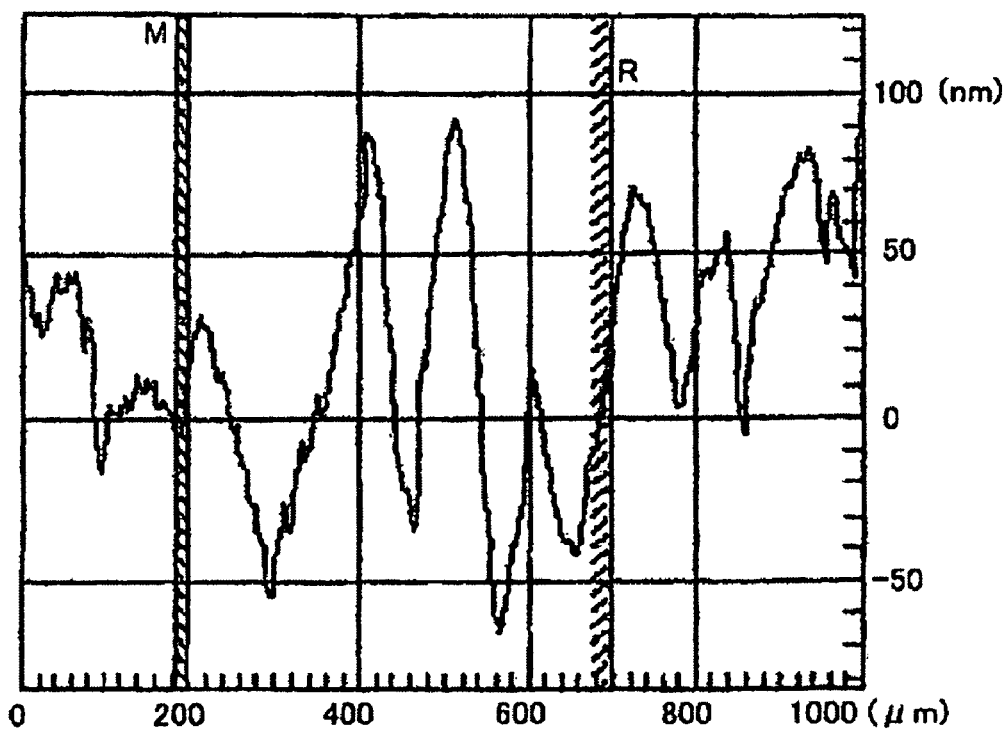
FIG. 7 is a diagram showing the results of measuring, using a stylus surface profilometer, the surface roughness of a GaN film corresponding to that in FIG. 5C, deposited at a thickness of 2 μm.

FIGS. 6 and 7 are diagrams showing the results of measuring, using a stylus surface profilometer, the surface roughness of GaN films deposited at 2 µm thickness, corresponding to those in FIGS. 4C and 5C. In the FIG. 7 roughness profile of the comparative example peaks and valleys whose height/depth is 50 nm to 150 nm, at a pitch of 100 µm to 150 µm are ascertainable. This is analogous to the roughness from the hexagonal hillocks verified in the FIG. 5C differential-interference-microscopy photograph. In FIG. 6 of the present-invention example, on account of the film-deposition process having been carried out after pretreatment at 1025° C. was performed, no heavy roughness can be ascertained.

Addenda Regarding Embodying Mode and Embodiment Example of the Present Invention In the embodying mode and embodiment example, only an example of a GaN substrate and a GaN film formed atop the substrate were described, but the scope of the present invention most broadly is not restricted to GaN-based semiconductor elements—they may be other nitride-based semiconductor devices as well.

The amplitude of the roughness of the semiconductor substrate, etc. in the semiconductor devices of the present invention is based on the roughness prior to a thin film being formed on the substrate, etc.—with the description, including that of the mode for carrying out the invention, presuming that even once other thin films have been formed on the substrate, etc. the roughness will not undergo a significant change. Nevertheless, the actual amplitude of the roughness in the front side after it has been fabricated into semiconductor devices will depend significantly on the measuring method—particularly in implementations in which the surface roughness is exposed by etching, on the etching technique. And it will also depend on the precision of the device with which the roughness is measured. It is believed that, in determining the roughness amplitude of the surface of the respective areas in the semiconductor devices of the present invention, the best measuring method and the best measuring device have been specified.

In the foregoing, an explanation has been made of modes for embodying the present invention, but the embodiments of the present invention disclose above are ultimately illustrative examples; the scope of the present invention is not limited to these embodiments. The scope of the present invention is indicated by the recitations of the scope of the patent claims, and includes meanings equivalent to the recitations of the scope of the patent claims and all modifications within the scope.

INDUSTRIAL APPLICABILITY

Utilizing according to the present invention nitride-based semiconductor devices and a method of their manufacture makes it possible to achieve nitride-based semiconductor devices containing epitaxial films excelling in flatness and crystallinity.

What is claimed is:

1. A method of manufacturing nitride-based semiconductor devices formed onto a semiconductor substrate being a compound containing nitrogen, and a Group IIIA element for forming compounds with nitrogen, the nitride semiconductor device manufacturing method comprising:
   a step of heating the semiconductor substrate to a film-deposition temperature;
   a step of supplying to the substrate a film-deposition gas containing a source gas for the Group IIIA element and a nitrogen source gas;
   a step of epitaxially growing onto the semiconductor substrate a thin film of a compound containing nitrogen and the Group IIIA element; and
   a step, in advance of the epitaxial growth step, of heating the semiconductor substrate to a pretreating temperature that is constant and that is less than the film-deposition temperature, and supplying to the substrate a pretreatment gas in which the proportion of Group-IIIA-element source gas has been reduced below what the proportion is in the film-deposition gas for the epitaxial growth step, to clean the front side of the semiconductor substrate.

2. The nitride semiconductor device manufacturing method as set forth in claim 1, wherein the pretreatment gas does not contain the source gas for the Group IIIA element.

* * * * *

UNITED STATES PATENT AND TRADEMARK OFFICE
CERTIFICATE OF CORRECTION

| | | |
|---|---|---|
| PATENT NO. | : 7,781,314 B2 | Page 1 of 1 |
| APPLICATION NO. | : 11/958315 | |
| DATED | : August 24, 2010 | |
| INVENTOR(S) | : Takashi Kyono et al. | |

It is certified that error appears in the above-identified patent and that said Letters Patent is hereby corrected as shown below:

On the Title page, at item (62) under the heading Related U.S. Application Data, "Division of application No. 10/514,261, filed on Nov. 3, 2004, now abandoned" should read --Division of Application No. 10/514,261, filed on Nov. 3, 2004, now abandoned, and which was the National Stage of International Application No. PCT/JP04/01944, filed on Feb. 19, 2004, now expired--.

In the Specifications:

In Column 1, under CROSS-REFERENCE TO RELATED APPLICATIONS at Line 5, "This application is a division of U.S. patent application Ser. No. 10/514,261 filed Nov. 3, 2004, now abandoned, and incorporated herein by reference" should read --This application is a division of U.S. Patent Application Ser. No. 10/514,261, filed on Nov. 3, 2004, now abandoned, and which was the National Stage of International Application No. PCT/JP04/01944, filed on Feb. 19, 2004, now expired--.

Signed and Sealed this
Fourth Day of June, 2013

Teresa Stanek Rea
*Acting Director of the United States Patent and Trademark Office*